United States Patent
Ono

(10) Patent No.: US 6,300,239 B1
(45) Date of Patent: Oct. 9, 2001

(54) METHOD OF MANUFACTURING SEMICONDUCTOR DEVICE

(75) Inventor: Atsuki Ono, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/433,932

(22) Filed: Nov. 4, 1999

(30) Foreign Application Priority Data

Nov. 6, 1998 (JP) .................................................. 10-316323

(51) Int. Cl.$^7$ ..................... H01L 21/336; H01L 21/4763; H01L 21/302; H01L 21/461
(52) U.S. Cl. ........................... 438/633; 438/301; 438/693
(58) Field of Search ..................... 438/633, 693, 438/785, 287, 305

(56) References Cited

U.S. PATENT DOCUMENTS

| | | | |
|---|---|---|---|
| 4,822,450 | * | 4/1989 | Davis et al. ........................... 156/643 |
| 4,922,312 | * | 5/1990 | Coleman et al. ..................... 357/23.6 |
| 5,198,269 | * | 3/1993 | Swartz et al. ......................... 427/226 |
| 5,272,104 | * | 12/1993 | Schrantz et al. ....................... 437/63 |
| 5,792,569 | * | 8/1998 | Sun et al. ............................... 428/692 |
| 5,872,376 | * | 2/1999 | Gardner et al. ....................... 257/336 |
| 6,001,731 | * | 12/1999 | Su et al. ............................... 438/633 |
| 6,060,406 | * | 5/2000 | Alers et al. ........................... 438/785 |

FOREIGN PATENT DOCUMENTS

| | | |
|---|---|---|
| 4-323829 | 11/1992 | (JP) . |
| 5-251463 | 9/1993 | (JP) . |
| 7-142726 | 6/1995 | (JP) . |
| 7-169917 | 7/1995 | (JP) . |
| 8-139327 | 5/1996 | (JP) . |
| 8-330441 | 12/1996 | (JP) . |
| 10-98004 | 4/1998 | (JP) . |
| 11-274489 | 10/1999 | (JP) . |

OTHER PUBLICATIONS

Park et al, "Plasma Induced Charging Damage on Thin Gate Oxide", Feb. 1999, IEEE, pp. 497–500.*
Yoneda et al, "A Concept of Gate Oxide Lifetime Limited by "B–mode" Stress Induced Leakage Currents in Direct Tunneling Regime", Jan. 1999, VLSI Technology Digest of Technical Papers, pp. 57–58.*
Monthly Semiconductor World, vol. 17, No. 5, May 1998, pp. 76–80.

* cited by examiner

Primary Examiner—John F. Niebling
Assistant Examiner—Walter L. Lindsay, Jr.
(74) Attorney, Agent, or Firm—Sughrue, Mion, Zinn, Macpeak & Seas, PLLC

(57) ABSTRACT

In manufacturing a MOS field effect transistor having a gate oxide film with a thickness of 3 nm or less, a deposition treatment or the like is performed under the condition that the substrate temperature is 650 to 770° C., and thereafter an annealing treatment is carried out under the condition that the substrate temperature is 900 to 1100° C.

15 Claims, 13 Drawing Sheets

(e)

(f)

(g) lamp annealing (a)

ion implantation
(b)

lamp annealing
(c)

(d)

(e)

(f)

(g)

over-etching region

METHOD OF MANUFACTURING SEMICONDUCTOR DEVICE

BACKGROUND OF THE INVENTION

1. Field of the Invention

The present invention relates to a method of manufacturing a semiconductor device including a process of deposition, heat treatment or the like that is carried out, under the condition that the substrate temperature is 600 to 770° C. after formation of a gate electrode over a gate oxide film with a film thickness of 3 nm or less.

2. Description of the Related Art

Referring to FIGS. 4 to 6, a conventional method of manufacturing a filed effect transistor is described.

First, after an element isolation region 2 is formed on the surface of a semiconductor substrate 1, a gate oxide film 3 (3 nm in thickness) is formed on the semiconductor substrate 1 by the thermal oxidation method and then polysilicon 4 (150 nm in thickness) is formed thereon. Next, over the polysilicon 4, a photoresist (not shown in the drawings) is applied and, using this as a mask, the polysilicon 4 and the gate oxide film 3 are patterned into the shape of a gate electrode. Following that, $BF_2$ implantation is carried out over the entire surface to form a SD (source-drain) extension region 5. The condition for the $BF_2$ implantation is, for example, that an accelerating energy is 5 keV and a dose is $2 \times 10^{14}$ cm$^{-2}$ or so. Thereafter, a sidewall 6 and a through oxide film 7 are formed and the structure shown in FIG. 4(a) is obtained.

Next, by applying another ion implantation through a through oxide film 7 over the entire surface, doping into the gate electrode and formation of a source-drain region 8 are carried out (FIG. 4(b)). The condition for this boron implantation is, for example, that an accelerating energy is 4 keV and a dose is $3 \times 10^{15}$ cm$^{-2}$ or so.

Subsequently, a lamp anneal is performed so as to bring about the activation within the gate electrode and the source-drain region. The condition for the lamp anneal is normally that the substrate temperature is 900 to 1000° C. and the annealing time is 5–10 seconds (FIG. 4(c)).

After the lamp anneal, cobalt 9 (20 nm is thickness) is deposited over the entire surface (FIG. 4(d)).

Next, a heat treatment is applied thereto in nitrogen atmosphere at 600 to 700° C. for 10 seconds and, then, after removing the superfluous cobalt, another anneal is performed in nitrogen atmosphere at 800° C. for 10 seconds, and thereby cobalt 9 is turned to silicide 91 (FIG. 5(e)). Turning to silicide, cobalt 9 with a film thickness of 10 nm becomes cobalt silicide 91 with a film thickness of 30–40 nm. The formation of cobalt silicide facilitates to lower the resistance of the gate electrode and the contact resistance of the diffusion layers. A silicon nitride film 10 (50 nm in thickness) is then formed over the entire surface by the low-pressure thermal CVD (Chemical Vapor Deposition) method (FIG. 5(f)). The deposition temperature is set to be a 600 to 750° C. and the deposition time, 3–4 hours. The low-pressure thermal CVD method is employed therein, since a silicon nitride film formed by this method serves well as an etching stopper. Furthermore, if the plasma CVD method is used, for example, it may cause adverse effects such as dielectric breakdown or the like on the gate oxide film.

Next, over the entire surface of the substrate, an interlayer film 11 (1000 nm in thickness) made of BPSG (Boro-Phospho-Silicate Glass) is formed by the plasma CVD method (FIG. 5(g)). The deposition temperature for that is 400° C. or so.

After that, a photoresist 13 is applied to the entire surface of the interlayer film 11 but an opening left at a prescribed position, and, then, by performing dry etching, a contact hole 12 is formed (FIG. 6(h)). As the etching gas, a gas having a high etching selectivity of BPSG to silicon nitride is used. After the silicon nitride film is exposed at the bottom of the contact hole 12, this silicon nitride film is subjected to another dry etching, with a CHF$_3$-based gas being used as the etching gas. This leads to the exposure of cobalt silicide at the bottom of the contact hole 12 (FIG. 6(i)).

After that, a barrier metal film made of Ti/TiN is formed around the inside wall of the contact hole and, by filling that with tungsten or the like, a contact plug is formed.

In the method described above, the silicon nitride film 10 is formed as shown in FIG. 5(f). Without this silicon nitride film 10, the leakage of the current may occur through overetching, if the position of the contact opening is slipped as shown in FIG. 9. A slight shift in alignment is a problem that can happen easily during the manufacturing process so that measures to cope with such a problem is a matter of importance. In the method described above, the silicon nitride film 10 serves as an etching stopper in forming the contact hole 12, and thereby a problem of the current leakage is eliminated.

Next, referring to the drawings, a conventional method of manufacturing a DRAM (Dynamic Random Access Memory) is described.

First, in the same way as the afore-mentioned conventional method of a field effect transistor, the steps shown in FIGS. 4–6 are performed. Next, after a Ti/TiN film 20 is formed inside of the contact hole as a barrier metal by the sputtering method, the hole is buried with tungsten 21 by the thermal CVD method with the deposition temperature set at 400° C. or so. The subsequent planarization of the surface by the CMP method brings the structure shown in FIG. 11(a).

A lower capacitor-electrode layer 31 (100 nm in thickness) composed of Ti, TiN and Pt is then formed over the entire surface by the sputtering method. Over this, a PZT (PbZr$_x$Ti$_{1-x}$O$_3$) film 32 is also formed by the sputtering method (FIG. 11(b)). These sputterings are carried out, for example, under the condition that the substrate temperature is 650 to 750° C. and the sputtering time is 10–60 minutes or so.

Next, an upper capacitor-electrode layer 33 made of lrO$_2$/Ir is formed over the entire surface by the sputtering method (FIG. 12(a)). After that, the lower capacitor-electrode layer 31, the PZT film 32 and the upper capacitor-electrode layer 33 are patterned by dry etching, and thereby a PZT capacitor 30 is formed (FIG. 12(b)).

With both conventional techniques described above, however, problems of increasing the resistance of the gate electrode and deteriorating the element response arise.

The present inventors made an investigation to elucidate causes of such problems and found out that they are caused by the gate depletion in the vicinity of the gate oxide film resulting from the deactivation of dopants which takes place in the step of forming a silicon nitride film 10 shown in FIG. 5(f).

This point is described below in detail, taking the case of the afore-mentioned conventional method of manufacturing a field effect transistor. In this manufacturing method, the lamp anneal performed at 900 to 1000° C. for 10 seconds or so in the step of FIG. 4(c) brings about the activation within the gate electrode and the source-drain region 8. The silicon nitride film 10 is then formed, by the low-pressure thermal CVD method, setting the deposition temperature at 600 to 750° C., in the later step of FIG. 5(f). A heat treatment conducted in this temperature range, however, causes the deactivation of dopants and, as a result, the dopant concentration decreases. In other words, even if a certain activation of dopants is once achieved by a heat treatment performed in the later step at a temperature as low as 600 to 750° C. as described above, the activation of dopants settles down at a lower activation yield corresponding to this lower temperature.

Now, when the field effect transistor is in use, an application of a voltage to the gate electrode makes the depletion layer spread in the upper section of the gate oxide film. Moreover, the lower the dopant activation yield within the gate electrode is, the more this depletion layer spreads. Therefore, in the afore-mentioned conventional technique, a lowering of the dopant activation yield results in an expansion of the depletion layer, which gives rise to problems of increasing in the resistance of the gate electrode and deteriorating the element response.

Further, also in the afore-manufactured method of manufacturing a DRAM, while the lamp anneal is performed at 900 to 1000° C. for 10 seconds or so in the step of FIG. 4(c), the sputtering is carried out at 650 to 750° C., in the later step of FIG. 11(b), in forming the PZT film 32. This causes the deactivation of dopants and lowers the dopant concentration, which gives rise, as above, to the problems of increasing the resistance of the gate electrode and deteriorating the element response.

Meanwhile such problems accompanied with a lowering of the dopant activation yield as described above become more notable with the reduction of the film thickness of the gate oxide film. Especially in the case that the film thickness of the oxide film is 3 nm or less, the problems become very serious. When doped polysilicon is used as a constitutive material of the gate electrode, the depletion layer spreads in the gate electrode. The thickness of this depletion layer depends on the dopant concentration. The ratio of the capacitance of the depletion layer to the gate capacitance generally increases, as the gate oxide film becomes thinner. The close examination by the present inventors, however, showed that the effects of the depletion layer on the characteristics of transistors described above become strongly marked only when the gate oxide film becomes as thin as 3 nm or thinner so that this film thickness of 3 nm can be the critical point.

To satisfy recent demands that the miniaturization of elements is achieved, that is, 0.1 $\mu$m-level minute devices are realized, it is necessary that the film thickness of the gate oxide film is set to be 3 nm or less. Accordingly, an object of the present invention is to overcome problems arising specifically for the case that such a film thickness is set for the gate oxide film, namely, problems accompanied with the lowering of the dopant activation yield in a gate electrode as described above.

SUMMARY OF THE INVENTION

In light of the above problems, the present invention provides a method of manufacturing a semiconductor device which comprises the steps of:
(a) forming, on a semiconductor substrate, a gate electrode over a gate insulator film with a film thickness of 3 nm or less, and thereafter applying the dopant implantation over the entire surface;
(b) keeping said semiconductor substrate under the condition that the substrate temperature is 600 to 770° C.; and
(c) performing an annealing treatment under the condition that the substrate temperature is 900 to 1100° C.

In the present invention, the substrate temperature in step (b) is kept at 600 to 770° C. The investigation by the present inventors showed that, in such a temperature range, the deactivation of dopants within the gate electrode takes place. In the present invention, however, an annealing treatment is performed in step (c) under the condition that the substrate temperature is 900 to 1100° C. so that the dopants are again activated. This eliminates the problem of dopant deactivation and, consequently, solves the problems of increasing in the resistance of the gate electrode and deteriorating the element response.

In step (b) of the present invention, the semiconductor substrate must be kept under the condition that the substrate temperature is 600 to 770° C. but, as long as this condition is met, various working treatments and deposition treatments are possible to be performed. The present invention is devised, in the first place, to overcome the problem of dopant deactivation which arises when (i) the gate insulator film has the film thickness not exceeding 3 nm and (ii) a treatment with the substrate temperature being kept at 600 to 770° C. is performed after the activation treatment of the gate electrode is carried out. Therefore, for the present invention, what is essential is that the semiconductor substrate is kept within the above temperature range, and what treatment is performed under this condition is not particularly limited. For example, the treatments possibly performed in such a temperature range include the CVD method, the sputtering method, the deposition method through the crystal growth and the like, the heat treatment for thermal oxidation, silicide formation, crystallization and the like, the doping treatment such as ion implantation and ion diffusion, the gettering treatment, the etching treatment, the treatment for HSG (Hemi-Spherical Silicon Grain) formation and the like. Among these treatments, the deposition treatment to form a silicon nitride film or the like, and the treatment to form or crystallize dielectrics for a dielectric memory are preferable examples.

Further, the present invention provides a method of manufacturing a semiconductor device which comprises the steps of:
(a) forming, on a semiconductor substrate, a gate electrode over a gate insulator film with a film thickness of 3 nm or less, and thereafter applying the dopant implantation over the entire surface;
(b) performing a deposition treatment under the condition that the substrate temperature is 600 to 770° C.; and
(c) performing an annealing treatment under the condition that the substrate temperature is 900 to 1100° C.

In the invention described above, because the deposition treatment in step (b) is performed under the condition that the substrate temperature is 600 to 770° C., the deactivation of dopants takes place. An annealing treatment is, however, performed in step (c) under the condition that the substrate temperature is 900 to 1100° C. so that the dopants are again activated. This eliminates the problem of dopant deactivation and, consequently, solves the problems of increasing in the resistance of the gate electrode and deteriorating the element response.

The formation of a silicon nitride film is, for instance, one example of the deposition treatment performed in step (b). The purpose of the formation of the silicon nitride film is not particularly limited and, for instance, a silicon nitride film may be formed as an etching stopper. Since the silicon nitride film can take a high etching selectivity to a $SiO_2$ film, if an appropriate etching gas is selected, it is favourably used as an etching stopper in forming a contact hole, a through hole, an interconnection trench or the like. As the method of forming a silicon nitride film, the low-pressure thermal CVD method or the like is employed. The low-pressure thermal CVD method is known to produce a film that performs well as an etching stopper.

In step (a) of the invention described above, a -refractory metal may be formed over the entire surface after the dopant implantation is applied over the entire surface. This enables to lower the resistance of the gate electrode and the contact resistance of the diffusion layers. The refractory metals are preferably one or more metals selected from the group consisting of cobalt, tungsten, cobalt silicide and tungsten silicide. Such a metal material can reduce the contact resistances of the gate electrode and diffusion layers with effect and, further, can provide good durability against the heat treatment with a high temperature.

Further, the present invention provides a method of manufacturing a semiconductor device which comprises the steps of:

(a) forming, on a semiconductor substrate, a gate electrode over a gate insulator film with a film thickness of 3 nm or less and applying the dopant implantation over the entire surface, and thereafter forming an interlayer insulating film and then forming a conductive film within said interlayer insulating film;

(b) growing a silicon nitride film to cover said conductive film under the condition that the substrate temperature is 600 to 770° C.; and (c) performing an annealing treatment under the condition that the substrate temperature is 900 to 1100° C.

In the invention described above, because the silicon nitride film is grown, in step (b), under the condition that the substrate temperature is 600 to 770° C., the deactivation of dopants takes place. An annealing treatment is, however, performed in step (c) under the condition that the substrate temperature is 900 to 1100° C. so that the dopants are again activated. This eliminates the problem of dopant deactivation and, consequently, solves the problems of increasing in the resistance of the gate electrode and gate depletion effect.

In step (a) of the invention described above, after forming an interlayer insulating film, a conductive film is formed within this interlayer insulating film. The conductive film herein is a metal film filling a through hole or a contact hole, a metal film constituting an interconnection, or the like.

The silicon nitride film formed in step (b) of the invention described above serves as an etching stopper in forming a contact hole, a through hole, an interconnection trench or the like. It also has the effects of preventing metal contaminants that may be produced in forming a hole or an interconnection trench from diffusing into element regions through an interlayer insulating film and affecting elements adversely. Further, in the case that, for example, copper, copper alloy or the like is used as a material for the conductive film, the following effects are known. That is, because the surface of the conductive film is covered with the silicon nitride film in the etching step for the formation of a hole or a trench, the conductive film is hardly directly exposed to the etching gas so that the amount of metal contaminants produced by etching a part of the conductive film can be reduced. To obtain the above effects, the low-pressure thermal CVD method capable to provide a dense film of quality is preferably used as the method of forming a silicon nitride film.

Further, the present invention provides a method of manufacturing a semiconductor device having, on a semiconductor substrate, a field effect transistor and a capacitor consisting of a first electrode, a second electrode and a dielectric film sandwiched by these electrodes; which comprises the steps of:

(a) forming, on a semiconductor substrate, a gate electrode over a gate insulator film with a film thickness of 3 nm or less, and thereafter applying the dopant implantation over the entire surface;

(b) forming the first electrode, the dielectric film and the second electrode in this order; and (c) performing an annealing treatment under the condition that the substrate temperature is 900 to 1100° C.; wherein:

the formation of the dielectric film in step (b) is performed under the condition that the substrate temperature is 600 to 770° C.

In the invention described above, because the formation of the dielectric film as well as heat treatments are performed, in step (b), under the condition that the substrate temperature is 600 to 770° C., the deactivation of dopants takes place. An annealing treatment is, however, performed in step (c) under the condition that the substrate temperature is 900 to 1100° C. so that the dopants are again activated. This eliminates the problem of dopant deactivation and, consequently, solves the problems of increasing in the resistance of the gate electrode and deteriorating the element response.

"The formation of the dielectric film" in step (b) of the invention described above denotes a deposition treatment of forming a dielectric film by the sputtering method or the like, a post-anneal treatment after the deposition of the film and the like.

For the dielectric film in the present invention, a film made of a perovskite material is preferable and a PZT film is particularly preferable. When such a material is utilized, a capacitor with a high permittivity can be obtained, which facilitates to achieve miniaturization of elements. On the other hand, in that case, it becomes necessary to perform a post anneal in order to grow a dielectric film or form the perovskite structure in a temperature range of 600 to 700° C. On such an occasion, if the thickness of the gate insulator film is not exceeding 3 nm, there arise problems of increasing in the resistance of the gate electrode and gate depletion effect due to the deactivation of dopants. The present invention can eliminate these problems even when such a high dielectric material as described above is utilized and, in addition, can provide a larger degree of freedom over the settings of the deposition of the dielectric film and the annealing process.

As described above, in the present invention, to manufacture s semiconductor device whose gate insulator film has a film thickness of 3 nm or less, the substrate temperature is initially kept at 600 to 770° C. and thereafter an annealing treatment is performed under the condition that the substrate temperature is 900 to 1100° C. As a result, the problems of increasing in the resistance of the gate electrode and deteriorating the element response which arise with the lowering of the dopant activation yield can be overcome with effect.

In the present invention, the gate insulator film can be an oxide film such as silicon oxide film.

DETAILED DESCRIPTION OF THE PREFERRED EMBODIMENTS

Figure 1:
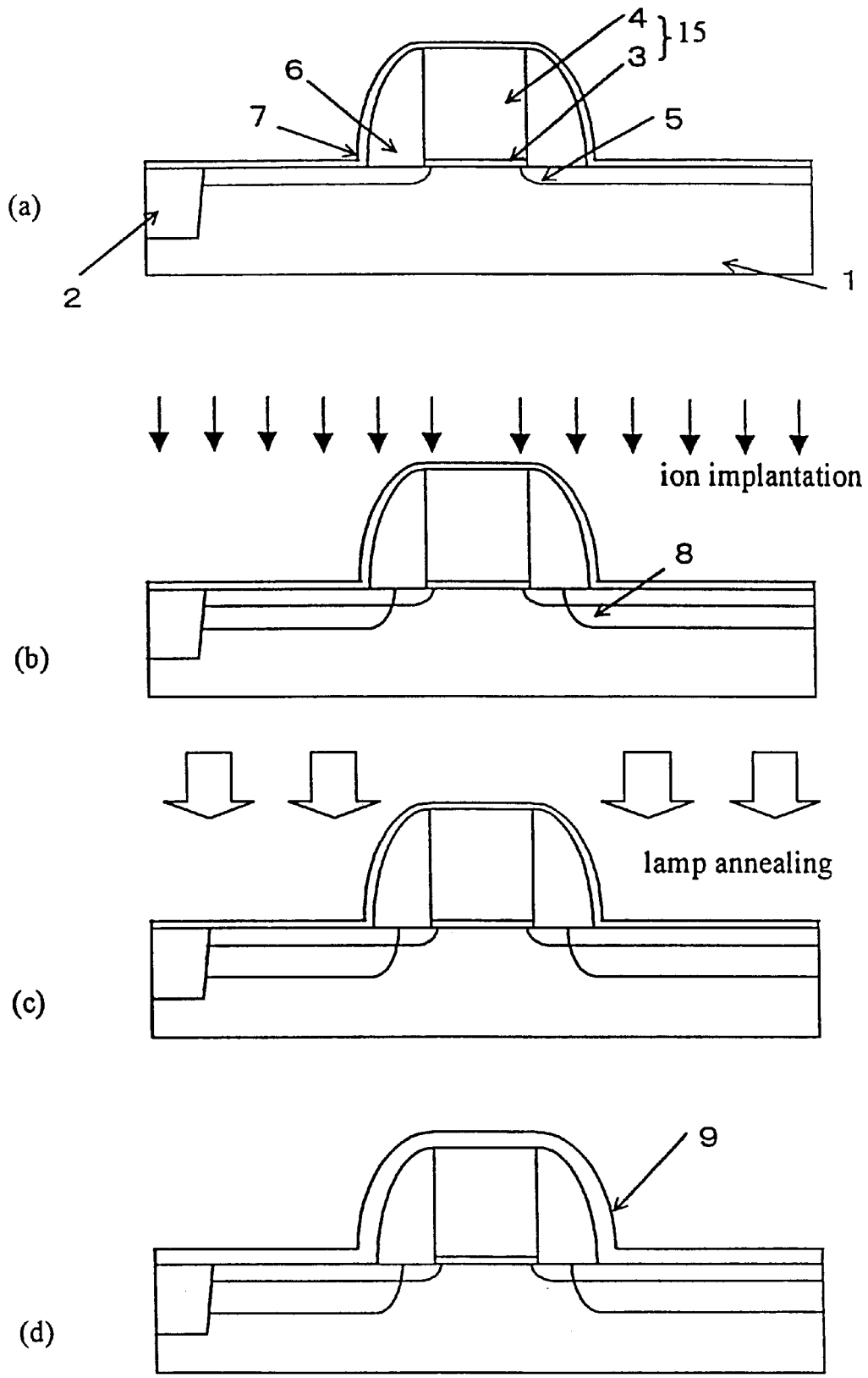
FIG. 1 is a series of schematic cross-sectional views illustrating the steps of a method of manufacturing a semiconductor device in accordance with the present invention.

In every method of the present invention described above, a gate electrode is formed, on a semiconductor substrate, over a gate insulator film with a film thickness of 3 nm or less, and thereafter the entire surface is subjected to the dopant implantation, in step (a). The semiconductor substrate herein is a silicon or SOI (Silicon on Insulator) substrate or the like. The film thickness of the gate insulator film is the average film thickness and set to be 3 nm or less. Such a film thickness, if set, facilitates to achieve the miniaturization of elements but, at the same time, gives rise to a marked gate depletion, against which the present invention provides counteractive measures. In other words, the present invention is devised to overcome specific problems that arise in designing a miniaturized device with a gate insulator film not exceeding 3 nm.

The gate electrode herein can be the one made of a polysilicon film formed on the gate insulator film or, alternatively, the one made of a polysilicon film and a refractory metal film formed, in this order, on the gate insulator film. The refractory metals are preferably one or more metals selected from the group consisting of cobalt, tungsten, cobalt silicide and tungsten silicide. Such a metal material can reduce the contact resistances of the gate electrode and diffusion layers with effect and, further, can provide good durability against the heat treatment with a high temperature.

Gate electrode of these sorts can be formed, for example, through the following steps. That is, a gate insulator film is first formed on a semiconductor substrate and a polysilicon film is formed thereon, and thereafter the polysilicon film is patterned, by which a gate electrode with the structure described above may be formed. Alternatively, a gate insulator film is formed on a semiconductor substrate and a polysilicon film and a refractory metal film are formed thereon, and thereafter the polysilicon film and the refractory metal film are patterned, by which a gate electrode with the structure described above may be formed.

In the present invention, the dopant implantation applied to the entire surface after the gate electrode is formed puts dopants into the gate electrode, and besides, forms dopant diffusion layers in a surrounding section of the gate electrode. As dopants, elements generally used to give conductivity to semiconductor materials are utilized in the present invention, as well. When a group IV element is used for the substrate material, a group III or group V element is utilized as dopants. Among elements of these groups, it is arsenic, phosphorus or boron with that the present invention produces good effects. Such dopants being implanted into the gate electrode, particularly serious problems of the gate depletion are brought about so that the effects of the present invention become the most significant.

In the present invention, a dose of the dopant implantation in step (a) is appropriately set, depending on the thickness of the gate electrode or the like. For example, when the gate electrode is 100 to 200 nm thick, a dose is preferably $1 \times 10^{15}$ to $1 \times 10^{16}$ cm$^{-2}$. Normally an annealing for activation of the dopant implantation is carried out after a gate electrode is formed. In this instance, the dopant concentration within the gate electrode becomes $1 \times 10^{19}$ to $1 \times 10^{21}$ cm$^{-3}$, in many cases $1 \times 10^{19}$ to $1 \times 10^{20}$ cm$^{-3}$, after the activation makes it uniform. With such a concentration, serious problems of the gate depletion are brought about so that the effects of the present invention become the most significant.

In the present invention, any treatment in step (b) is performed under the condition that the substrate temperature is 600 to 770° C. The time period for this treatment is preferably 10 minutes or longer and more preferably 60 minutes or longer, because, with such a treatment time, the treatment at 600 to 770° C. brings about marked deactivation of dopants. While there is no maximum for the treatment time, normally a working treatment does not last for more than 10 hours.

In the present invention, an annealing treatment in step (c) is performed under the condition that the substrate temperature is 900 to 1100° C. The annealing treatment at such a temperature can again activate the dopants that have been once deactivated. The condition for this treatment is preferably the one that makes the dopants within the source-drain region or the gate electrode activated and, therefore, it should be exactly the same or almost the same as such. For the formation of devices of 0.1 µm-level, this condition is preferably that the substrate temperature is 900 to 1100° C. and the annealing time is 5–20 seconds. Such a condition can produce shallow diffusion layers substantially safe from short channel effects and can activate dopants satisfactorily, and, moreover, can maintain well characteristics of cobalt silicide formed in an earlier step, without a change.

With respect to the afore-mentioned annealing treatment, it is preferable to utilize a heat treatment by the RTA (Rapid Thermal Annealing) and more preferable to use a lamp annealing treatment. These treatments can accomplish the activation of dopants within a short time and, consequently, can control well such adverse effects they have on the elements disposed on the substrate or on the diffusion state in the dopant diffusion layers as described above. Especially when shallow diffusion layers are formed, the treatment by the RTA or the lamp anneal is effective.

EXAMPLE 1

Figure 2:
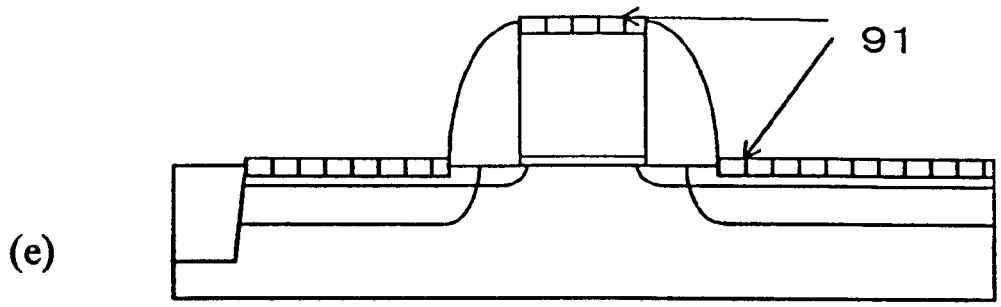
FIG. 2 is a series of schematic cross-sectional view illustrating further steps of the method of manufacturing a semiconductor device in accordance with the present invention.
Figure 2:
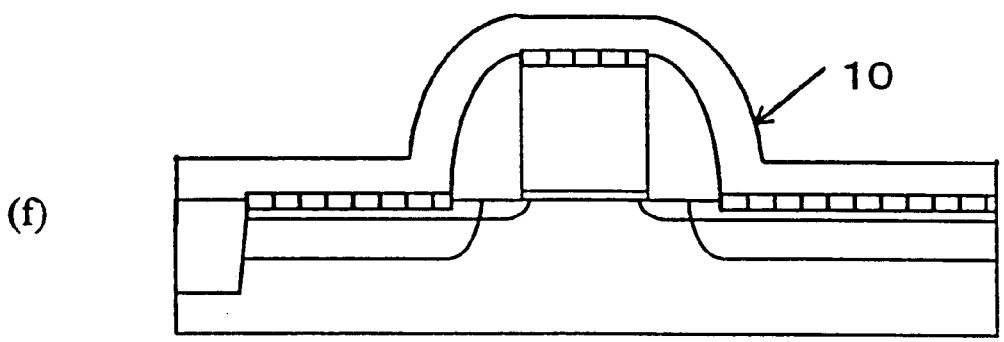
Figure 2:
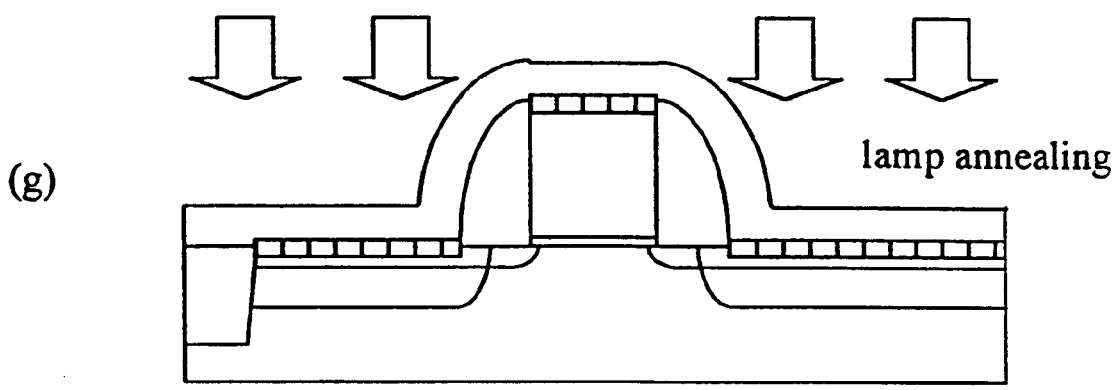
Figure 3:
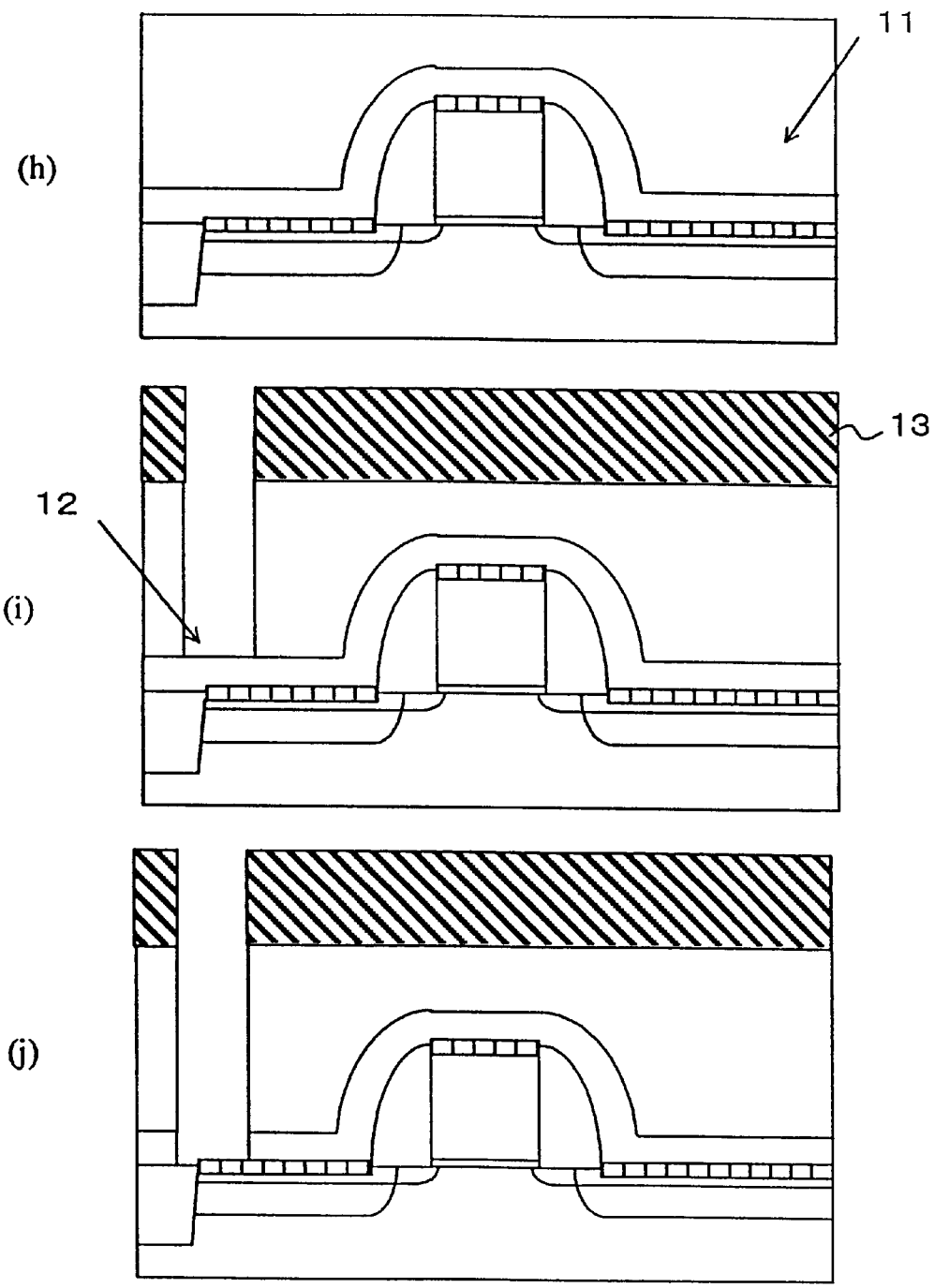
FIG. 3 is a series of schematic cross-sectional views illustrating further steps of the method of manufacturing a semiconductor device in accordance with the present invention.

Referring to FIGS. 1 to 3, the present example is described.

First, after an element isolation region 2 is formed on the surface of a semiconductor substrate 1, a gate oxide film 3 (3 nm in thickness) is formed on the semiconductor substrate 1 by the thermal oxidation method and then polysilicon 4 (150 nm in thickness) is formed thereon. Next, over the polysilicon 4, a photoresist (not shown in the drawings) is applied and, using this as a mask, the polysilicon 4 and the gate oxide film 3 are patterned into the shape of a gate electrode. Following that, $BF_2$ implantation is carried out over the entire surface to form a SD (source-drain) extension region 5. The condition for the $BF_2$ implantation is that an accelerating energy is 5 keV and a dose is $2 \times 10^{14}$ cm$^{-2}$. Thereafter, a sidewall 6 and a through oxide film 7 are formed and the structure shown in FIG. 1(a) is obtained.

Next, by applying another ion implantation through a through oxide film 7 over the entire surface, doping into the gate electrode and formation of a source-drain region 8 are carried out (FIG. 1(b)). The condition for this boron implantation is that an accelerating energy is 4 keV and a dose is $3 \times 10^{15}$ cm$^{-2}$.

Subsequently, a lamp anneal is performed so as to bring the activation within the gate electrode and the source-drain region. The condition for the lamp anneal is that the substrate temperature is 1000° C. and the annealing time is 10 seconds (FIG. 1(c)).

After the lamp anneal, cobalt 9 (10 nm in thickness) is deposited over the entire surface, as shown in FIG. 1(d). The substrate temperature in the sputtering is set at 400° C.

Next, a heat treatment is applied thereto in nitrogen atmosphere at 600 to 700° C. for 10 seconds and, then, after removing the superfluous cobalt, another anneal is performed in nitrogen atmosphere at 800° C. for 10 seconds, and thereby cobalt 9 is turned to silicide (FIG. 2(e)). Turning to silicide, cobalt 9 with a film thickness of 10 nm becomes cobalt silicide with a film thickness of 30–40 nm. The formation of cobalt silicide facilitates to lower the resistance of the gate electrode and the contact resistance of the diffusion layers.

A silicon nitride film 10 (50 nm in thickness) is then formed over the entire surface by the low-pressure thermal CVD (Chemical Vapor Deposition) method (FIG. 2(f)). The deposition temperature is set to be at 630° C. and the deposition time, 3 hours. The low-pressure thermal CVD method is employed therein, since a silicon nitride film formed by this method has a denser nature and serves well as an etching stopper. Furthermore, if the plasma CVD method is used, for example, it may cause adverse effects such as dielectric breakdown or the like on the gate oxide film.

Next, a lamp annealing treatment is carried out (FIG. 2(g)). The substrate temperature at the time of annealing is set to be approximately 950° C. and the annealing time, approximately 10 seconds.

Next, a ramp annealing treatment is carried out (FIG. 2(g)). The substrate temperature at the time of annealing is set to be approximately 950° C. and the annealing time, approximately 10 seconds.

Next, over the entire surface of the substrate, an interlayer film 11 made of BPSG is formed by the plasma CVD method (FIG. 3(h)). The deposition temperature for that is 400° C.

After that, a photoresist 13 is applied to the entire surface of the interlayer film 11 but an opening left at a prescribed position, and, then, by performing dry etching, a contact hole 12 is formed (FIG. 3(i)). As the etching gas, a mixed gas containing $C_4F_8$, Ar, $O_2$ and CO that has a high etching selectivity of BPSG to silicon nitride is used. After the silicon nitride film is exposed at the bottom of the contact hole 12, this silicon nitride film is subjected to another dry etching, with a $CHF_3$-based gas being used as the etching gas. This leads to the exposure of cobalt silicide at the bottom of the contact hole 12 (FIG. 3(j)).

After that, a barrier metal film made of Ti/TiN is formed around the inside wall of the contact hole and, by filling that with tungsten, a tungsten plug is formed.

Figure 7:
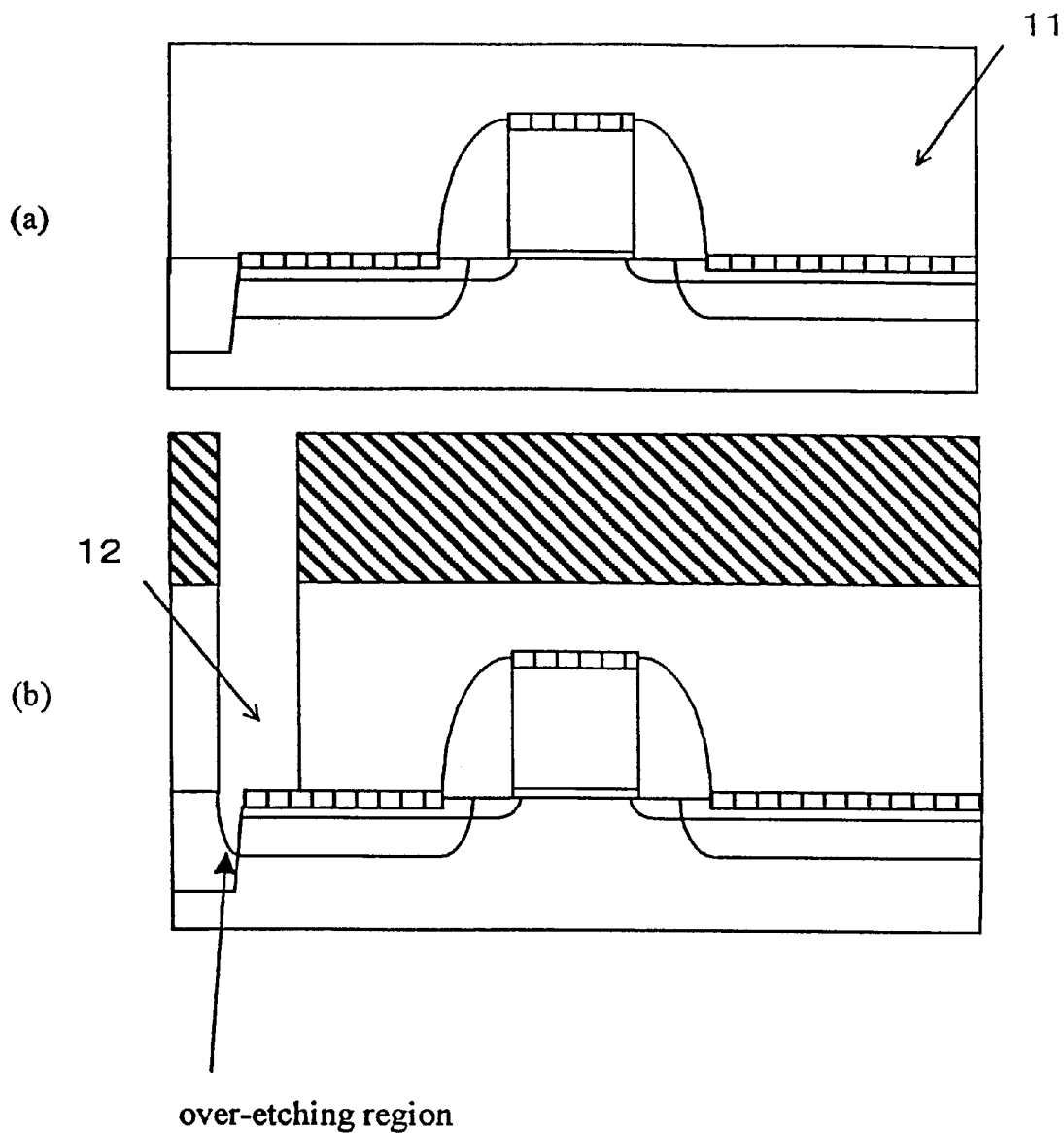
FIG. 7 is a series of schematic cross-sectional views illustrating the steps of a conventional method of manufacturing a semiconductor device.

In the method described above, the silicon nitride film 10 is formed on the dopant diffusion layers. Without this silicon nitride film 10, the leakage of the current may occur through overetching, as shown in FIG. 7. Especially when a slight shift in alignment arises, such a problem becomes marked. In the present example, the silicon nitride film 10 serves as an etching stopper in forming the contact 12, and thereby a problem of the current leakage is eliminated. The silicon nitride film 10 is formed by the low-pressure thermal CVD method, which improves the efficiency of the silicon nitride film as an etching stopper and further protects the gate oxide film from adverse effects.

In forming this silicon nitride film 10, the deactivation of dopants in the gate electrode takes place but, in the present example, after the formation of the silicon nitride film, a lamp anneal at 950° C. is again performed in the step of FIG. 2(g). This reactivates the dopants and overcomes the problem of the gate depletion.

Comparative Example 1

A MOS (Metal-Oxide-Semiconductor) field effect transistor was manufactured in the same way as First Example except that the RTA heat treatment (lamp annealing treatment) of FIG. 2(g) was not performed.

A MOS field effect transistor was manufactured in the same way as First example that the film thickness of the gate oxide film was set to be 5 nm and the RTA heat treatment (lamp annealing treatment) of FIG. 2(g) was not performed.

Reference Example 1

A MOS field effect transistor was manufactured in the same way as First example except that the film thickness of the gate oxide film was set to be 5 nm and the RTA heat treatment (ramp annealing treatment) of FIG. 2(g) was not performed.

Results of Evaluation

For MOS field effect transistors manufactured in First example, Comparative example 1 and Reference example 1, respective normalized gate capacitances were evaluated. For the case that the gate oxide film has a film thickness of 3 nm (First example, Comparative example 1), the gate bias was set at 1.5 V, and for the case that the gate oxide film has a film thickness of 5 nm (Reference example 1), the gate bias was set at 2.5 V. The gate capacitance in storage condition was each evaluated through a quasi-static C-V measurement and, using this value, the normalized gate capacitance in inversion condition was obtained. This value of the normalized gate capacitance is generally referred as the gate depletion rate, which determines the amount of the drain current in the transistor. It is known that the closer the value of this rate is to 1, the better characteristics the transistor has.

TABLE 1

| | Normalized gate capacitance |
|---|---|
| First example | 0.95 |
| Comparative example 1 | 0.83 |
| Reference example 1 | 0.96 |

The results in the TABLE 1 clearly indicate that the problem of the gate depletion seen in Comparative example 1 is eliminated in First example. Further, it is confirmed that the problem of the gate depletion does not arise in Reference example 1, because the gate oxide film thereof is as thick as 5 nm.

EXAMPLE 2

An example in that a multilevel interconnection structure is formed by a dual damascene process after the formation of a MOS field effect transistor is described.

First, the steps of FIGS. 1 to 3 are carried out in the same way as the manufacturing method of the field effect transistor of First example. Only the lamp annealing treatment of FIG. 2(g) is not performed.

A Ti/TiN film 20 is then formed inside of the contact hole as a barrier metal by the sputtering method, and thereafter the hole is buried with tungsten 21 by the thermal CVD method performed with a deposition temperature of 400° C. or so. The surface is subsequently planarized by the CMP (Chemical Mechanical Polishing) method.

Next, a lower-level interconnection shown in FIG. 8(a) is formed. A silicon oxide film 24 with a film thickness of 500 nm is first formed and then a section thereof at a prescribed position is etched by dry etching so as to expose tungsten 21. Next, a TiN film 22 (15 to 30 nm in thickness) is grown over the entire surface as a barrier metal film by the sputtering method. After a copper film 23 is grown thereon by the sputtering method in such a way that the trench section is buried, superfluous parts of the TiN film 22 and the copper film 23 that are formed outside of the trench section are removed by the CMP, and thereby the lower-level interconnection is accomplished.

Next, a silicon nitride film 25 with a film thickness of 100 nm is formed thereon by the low-pressure thermal CVD method (FIG. 8(a)). The deposition temperature is set to be 630° C. and the deposition time, 3 hours. The use of the low-pressure thermal CVD method, as compared with that of the plasma CVD method, furthers the dense nature of the film and improves its efficiency as an etching stopper.

A lamp annealing treatment is then performed. The substrate temperature at the time of annealing is set to be approximately 8 seconds.

After the formation of the lower-level interconnection, an interlayer film 26 (1200 nm in thickness) made of BPSG is formed by the plasma CVD method (FIG. 8(b)).

A resist mask 27a with a pattern of an opening (0.25 μm in diameter) is then formed thereon.

Figure 9A:
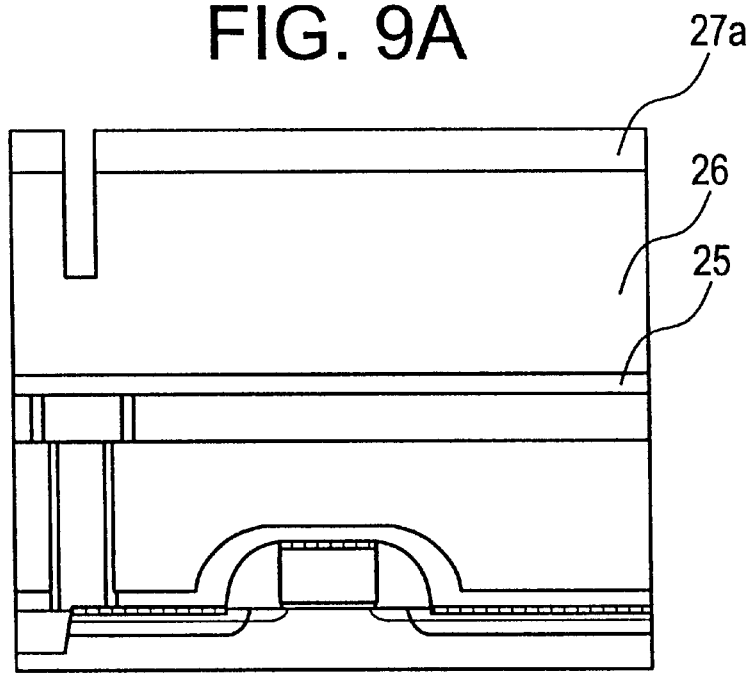
FIG. 9 is a series of schematic cross-sectional views illustrating further steps of the method of manufacturing a semiconductor device in accordance with the present invention.

Next, using this resist mask 27a, dry etching is carried out and an opening is partly formed in the BPSG film 26 (FIG. 9(a)). As the etching gas, a mixed gas containing $C_4F_8$, Ar, $O_2$ and CO is used. The termination of dry etching is made before the bottom of the opening reaches the level of the silicon nitride film 25. A peeling treatment of the resist mask 27a is then conducted by means of ashing with the oxygen plasma and cleaning with a peeling agent containing amines.

Next, a resist mask 27b is formed over the BPSG film 26. The diameter of an opening of the pattern therewith is larger than that with the resist mask 27a of FIG. 9(a) and set to be 0.3 μm. Using this resist mask 27b, dry etching is carried out and thereby a sectionally T-shaped opening is formed in the BPSG film 26 (FIG. 9(b)). As the etching gas, a mixed gas containing $C_4F_8$ and Ar is used. This gas has a large etching selectivity of the BPSG film 26 to the silicon nitride film 25 so that the etching is halted almost at the top level of the silicon nitride film 25. A peeling treatment of the resist mask 27b is then conducted by means of ashing with the oxygen plasma and cleaning with a peeling agent containing amines.

In the above etching step, the copper film 23 is covered with the silicon nitride film 25 and is hardly exposed to the etching gas directly. Therefore, the amount of copper-based metal contaminants which may be produced by etching a part of the copper film 23 and then stuck to the inside wall of the through hole can be reduced. Further, this silicon nitride film 25 also has the effects of preventing metal contaminants that are stuck to the inside walls of holes and trenches at the time of formation of through holes and interconnection layers in the following steps from diffusing and affecting elements adversely.

Figure 10A:
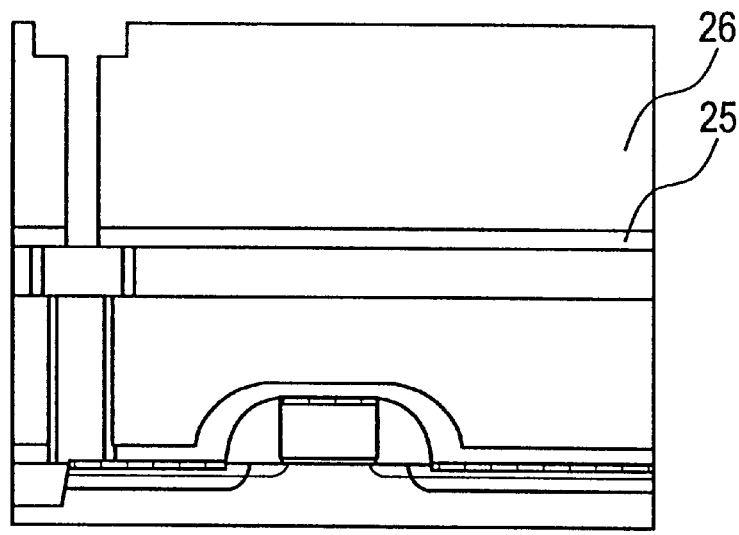
FIG. 10 is a series of schematic cross-sectional views illustrating further steps of the method of manufacturing a semiconductor device in accordance with the present invention.

The silicon nitride film 25 is then dry etched so as to expose the surface of the copper film 23 (FIG. 10(a)). The etching gas utilized is the $CHF_3$-based gas.

Figure 10B:
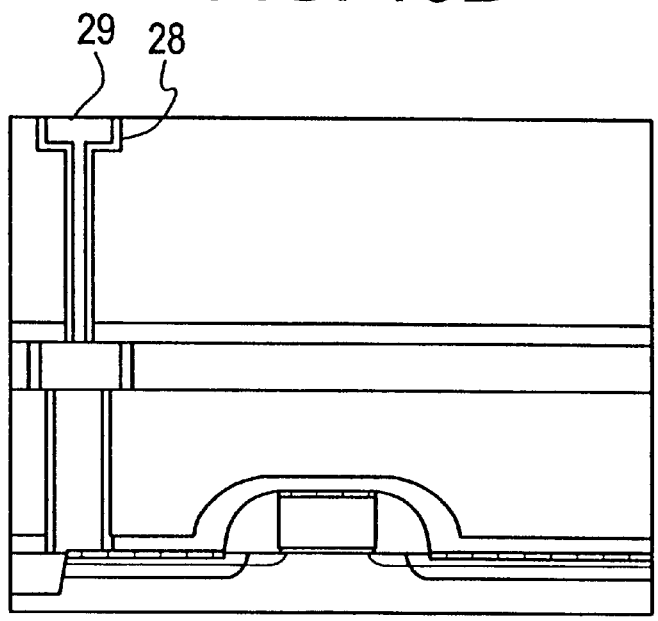

After that, a Ti/TiN film 28 and a tungsten film 29 are grown and a subsequent planarization of the surface by the CMP accomplishes a multilevel interconnection structure (FIG. 10(b)).

In the present example, the silicon nitride film 25 is formed by the low-pressure thermal CVD method conducted at the deposition temperature of 630° C. in the step of FIG. 8(a). Although this deposition method furthers the dense nature of the film and improves its efficiency as an etching stopper, it causes, if used in the prior art, problems that the dopants in the gate electrode become deactivated and the depletion of the gate is brought about when the transistor is in use. In the present example, however, the RTA is performed at 950° C. immediately after the step of FIG. 8(a) so that such problems are eliminated.

EXAMPLE 3

Next, referring to the drawings, an example of a manufacturing method of a DRAM is described.

First, the steps of FIGS. 1–3 are carried out in the same way as the manufacturing method of the field effect transistor of First example. Only the lamp annealing treatment of FIG. 2(g) is not performed.

Figure 11A:
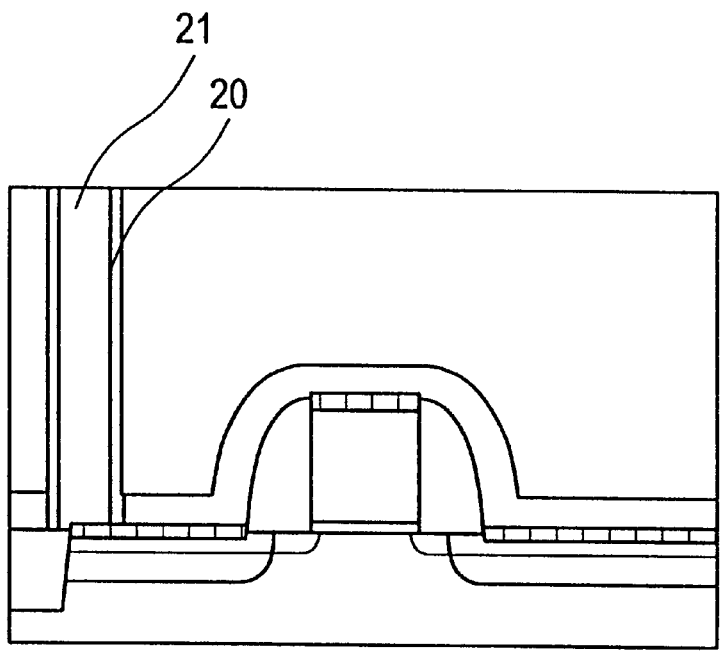
FIG. 11 is a series of schematic cross-sectional views illustrating the steps of a method of manufacturing a semiconductor device in accordance with the present invention.

Next, after a Ti/TiN film 20 is formed inside of the contact hole as a barrier metal by the sputtering method, the hole is buried with tungsten 21 by the thermal CVD method with the deposition temperature set at 400° C. or so and then the surface thereof is planarized by the CMP method (FIG. 11(a)).

A lower capacitor-electrode layer 31 (100 nm in thickness) composed of Ti, TiN and Pt is then formed over the entire surface by the sputtering method. Over this, a PZT ($PbZr_xTi_{1-x}O_3$) film 32 is also formed by the sputtering method (FIG. 11(b)). These sputterings are carried out under the condition that the substrate temperature is 670° C. and the sputtering time is 20 minutes or so.

Figure 13A:
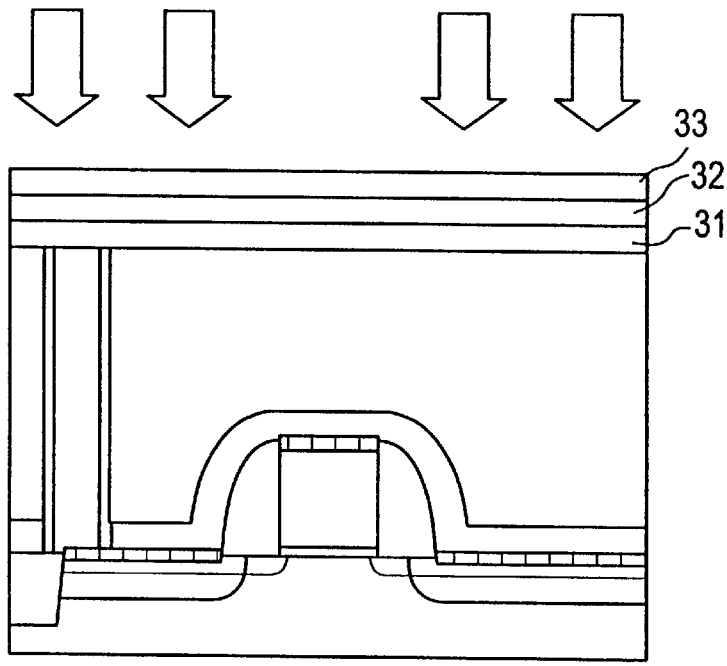
FIG. 13 is a series of schematic cross-sectional views illustrating further steps of the method of manufacturing a semiconductor device in accordance with the present invention.

Next, as shown in FIG. 13(a), an upper capacitor-electrode layer 33 made of $IrO_2/Ir$ is formed over the entire surface by the sputtering method. At this stage, a lamp annealing treatment is carried out. The substrate temperature at the time of annealing is set to be 950° C. and the annealing time, approximately 20 seconds.

After that, the lower capacitor-electrode layer 31, the PZT film 32 and the upper capacitor-electrode layer 33 are patterned by dry etching, and thereby a PZT capacitor 30 is formed (FIG. 13(*b*)).

In the present example, the PZT film 32 is formed by the sputtering method conducted at the deposition temperature of 670° C. in the step of FIG. 11(*b*). This deposition method has the advantages that the PZT film can be formed easily and the film composition can be controlled freely by devising an appropriate target of the sputtering. On the other hand, this method used to have problems that the dopants in the gate electrode become deactivated at the time of film formation and the depletion of the gate is brought about when the transistor is in use. In the present example, however, the RTA is performed at 950° C. in the step of FIG. 13(*a*) so that such problems are eliminated.

This application is based on Japanese patent application NO.HEI10-316323, the content of which is incorporated hereinto by reference.

What is claimed is:

1. A method of manufacturing a semiconductor device, comprising the steps of:
   (a) forming, on a semiconductor substrate, a gate electrode over a gate insulator film with a film thickness of 3 nm or less, and thereafter applying dopant implantation over the entire surface;
   (b) maintaining said semiconductor substrate under a condition that the substrate temperature is 600 to 700° C.; and
   (c) performing an annealing treatment under a condition that the substrate temperature is 900 to 1100° C.

2. A method of manufacturing a semiconductor device, comprising the steps of:
   (a) forming, on a semiconductor substrate, a gate electrode over a gate insulator film with a film thickness of 3 nm or less, and thereafter applying dopant implantation over the entire surface;
   (b) performing a deposition treatment under a condition that the substrate temperature is 600 to 770° C.; and
   (c) performing an annealing treatment under a condition that the substrate temperature is 900 to 1100° C.

3. The method of manufacturing a semiconductor device according to claim 2, wherein, in step (b), a silicon nitride film is grown under the condition that the substrate temperature is 600 to 770° C.

4. A method of manufacturing a semiconductor device, comprising the steps of:
   (a) forming, on a semiconductor substrate, a gate electrode over a gate insulator film with a film thickness of 3 nm or less and applying dopant implantation over the entire surface, and thereafter forming an interlayer insulating film and then forming a conductive film within said interlayer insulating film;
   (b) growing a silicon nitride film to cover said conductive film under a condition that the substrate temperature is 600 to 770° C.; and
   (c) performing an annealing treatment under a condition that the substrate temperature is 900 to 100° C.

5. A method of manufacturing a semiconductor device having, on a semiconductor substrate, a field effect transistor and a capacitor consisting of a first electrode, a second electrode and a dielectric film disposed between said electrodes, comprising the steps of:
   (a) forming, on a semiconductor substrate, a gate electrode over a gate insulator film with a film thickness of 3 nm or less, and thereafter applying dopant implantation over the entire surface;
   (b) forming the first electrode, the dielectric film and the second electrode in a predetermined order; and
   (c) performing an annealing treatment under a condition that the substrate temperature is 900 to 1100° C.,
   wherein formation of the dielectric film in step (b) is performed under a condition that the substrate temperature is 600 to 770° C.

6. The method of manufacturing a semiconductor device according to claim 5, wherein said dielectric film is made of a perovskite material.

7. The method of manufacturing a semiconductor device according to claim 5, wherein said dielectric film is made of a PZT film.

8. The method of manufacturing a semiconductor device according to claim 1, wherein said annealing treatment in step (c) is a RTA (Rapid Thermal Annealing) treatment.

9. The method of manufacturing a semiconductor device according to claim 2, wherein said annealing treatment in step (c) is a RTA (Rapid Thermal Annealing) treatment.

10. The method of manufacturing a semiconductor device according to claim 4, wherein said annealing treatment in step (c) is a RTA (Rapid Thermal Annealing) treatment.

11. The method of manufacturing a semiconductor device according to claim 5, wherein said annealing treatment in step (c) is a RTA (Rapid Thermal Annealing) treatment.

12. The method of manufacturing a semiconductor device according to claim 1, wherein said gate insulator film is an oxide film.

13. The method of manufacturing a semiconductor device according to claim 2, wherein said gate insulator film is an oxide film.

14. The method of manufacturing a semiconductor device according to claim 4, wherein said gate insulator film is an oxide film.

15. The method of manufacturing a semiconductor device according to claim 5, wherein said gate insulator film is an oxide film.

* * * * *

UNITED STATES PATENT AND TRADEMARK OFFICE
CERTIFICATE OF CORRECTION

PATENT NO.      : 6,300,239 B1
DATED           : October 9, 2001
INVENTOR(S)     : Atsuki Ono It is certified that error appears in the above-identified patent and that said Letters Patent is hereby corrected as shown below:

Column 1,
Line 13, delete "filed" insert -- field --

Figure 4:
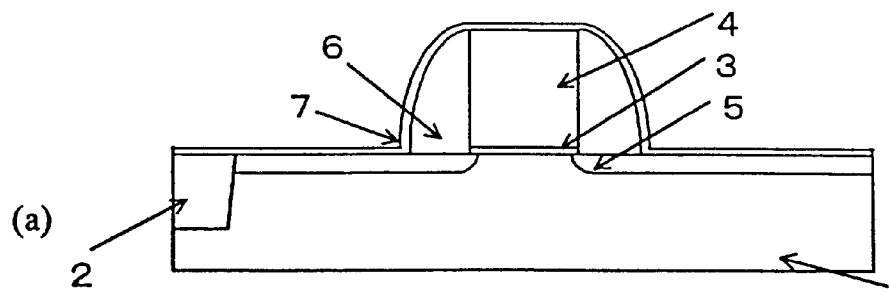
FIG. 4 is a series of schematic cross-sectional views illustrating the steps of a conventional method of manufacturing a semiconductor device.
Figure 4:
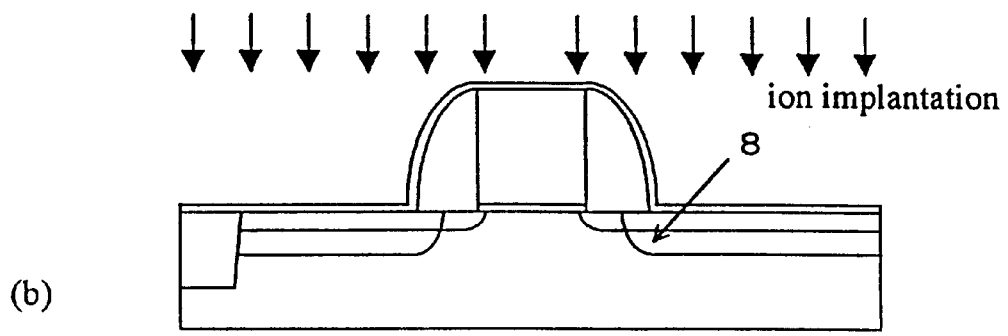
Figure 4:
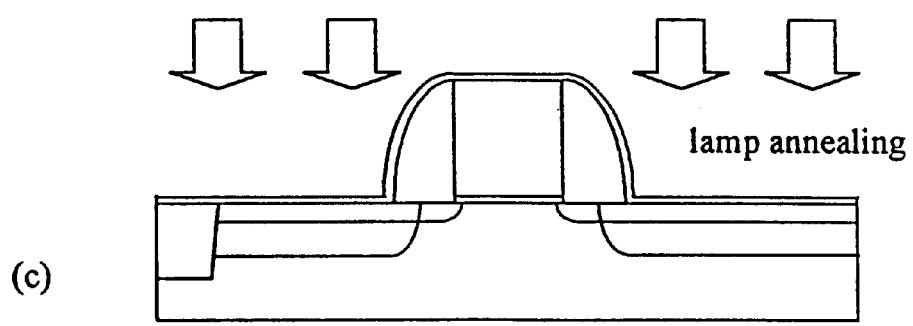
Figure 4:
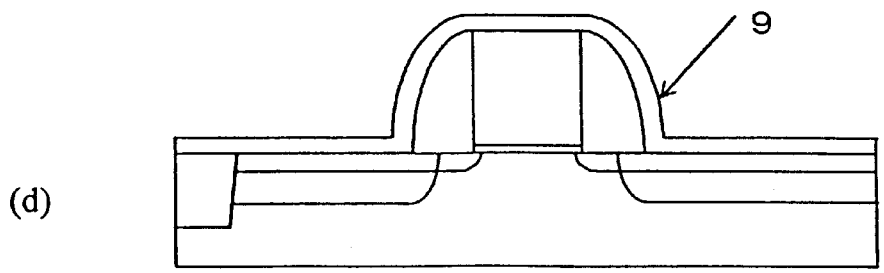
Figure 5:
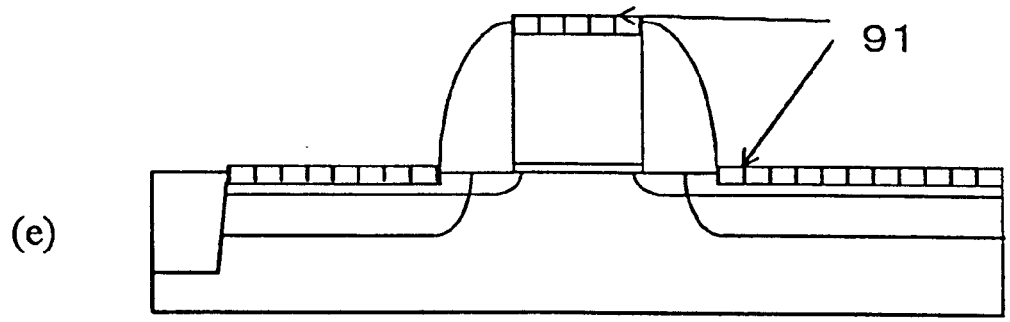
FIG. 5 is a series of schematic cross-sectional views illustrating further steps of the conventional method of manufacturing a semiconductor device.
Figure 5:
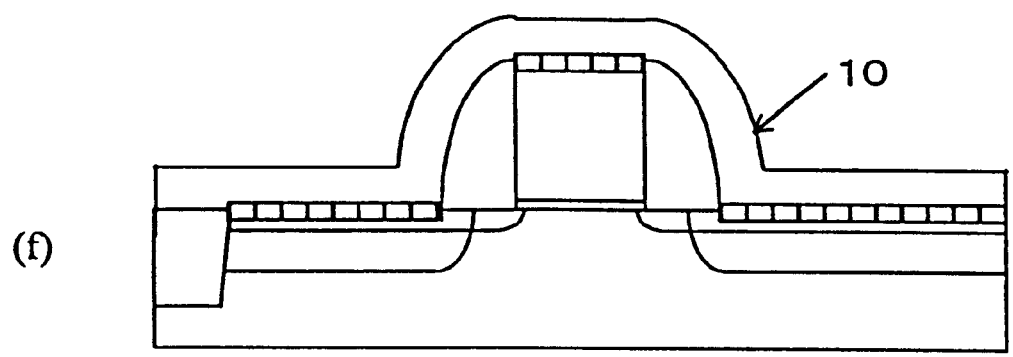
Figure 5:
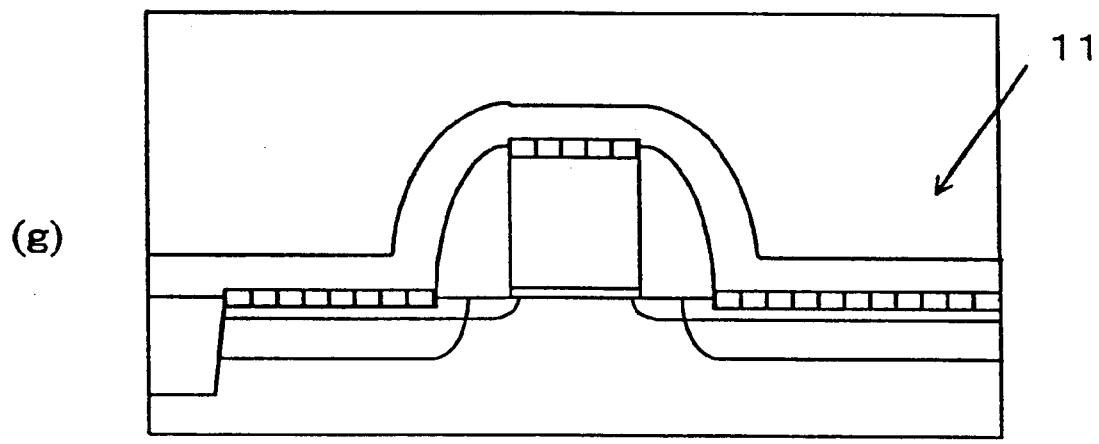
Figure 6:
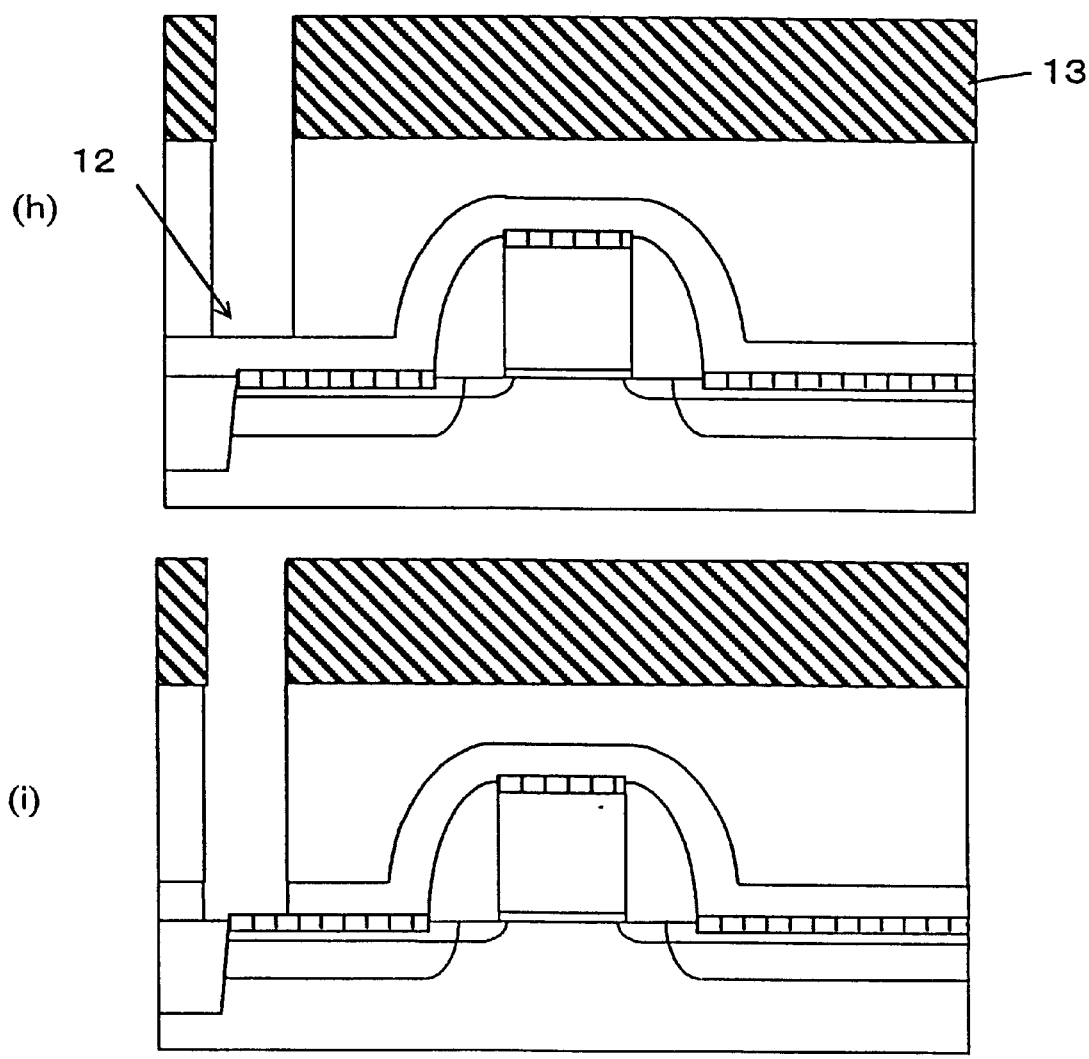
FIG. 6 is a series of schematic cross-sectional views illustrating further steps of the conventional method of manufacturing a semiconductor device.
Figure 8:
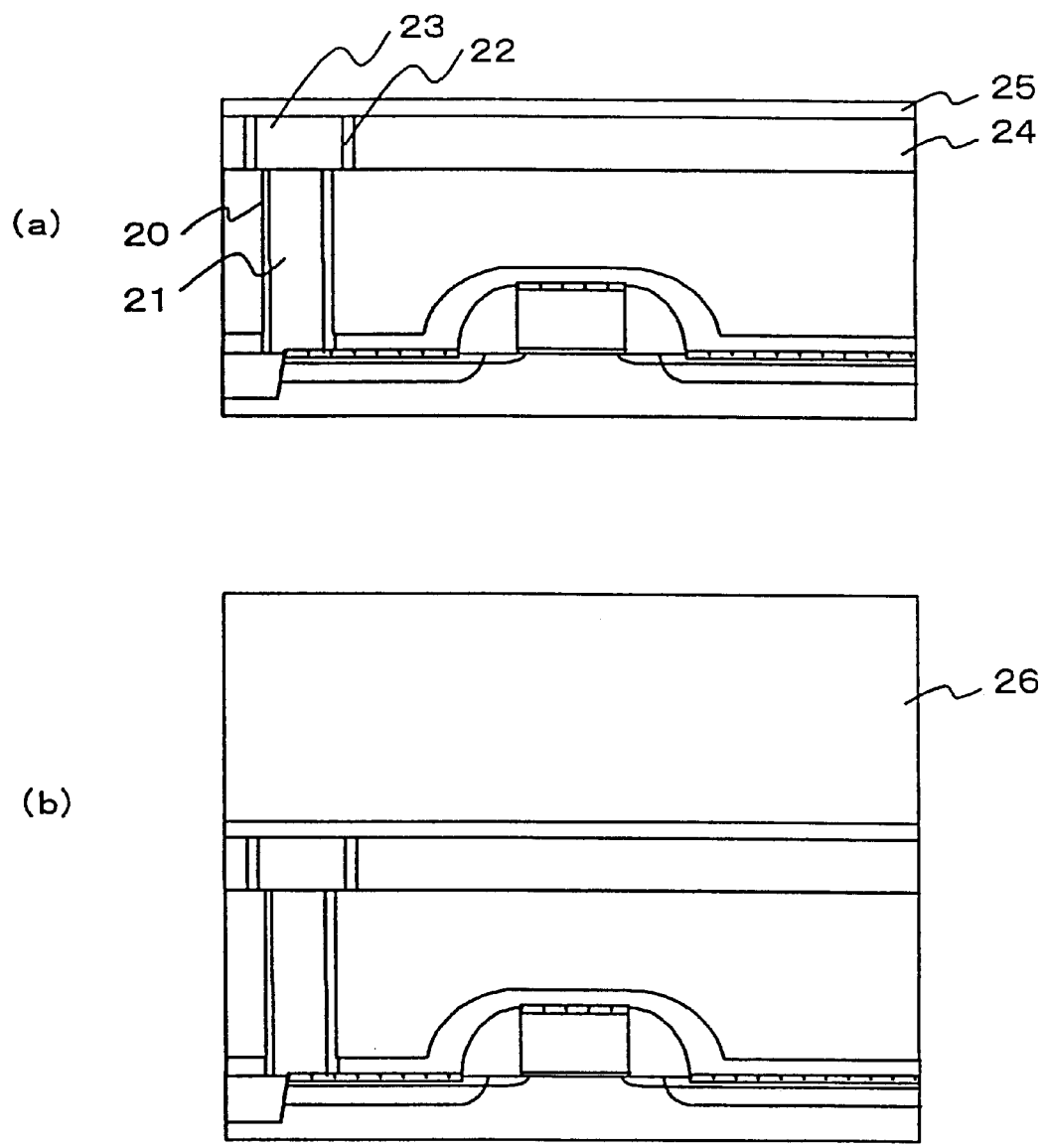
FIG. 8 is a series of schematic cross-sectional views illustrating the steps of a method of manufacturing a semiconductor device in accordance with the present invention.
Figure 9B:
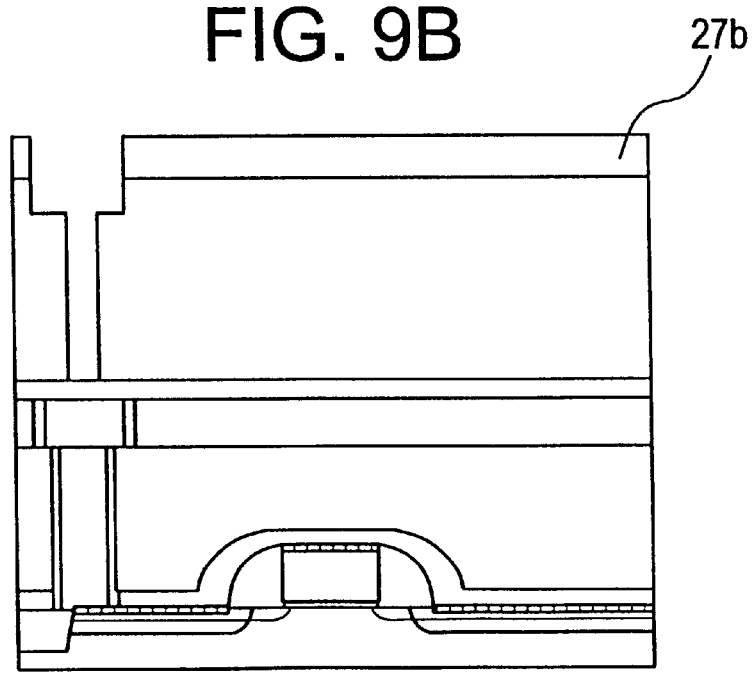
Figure 11B:
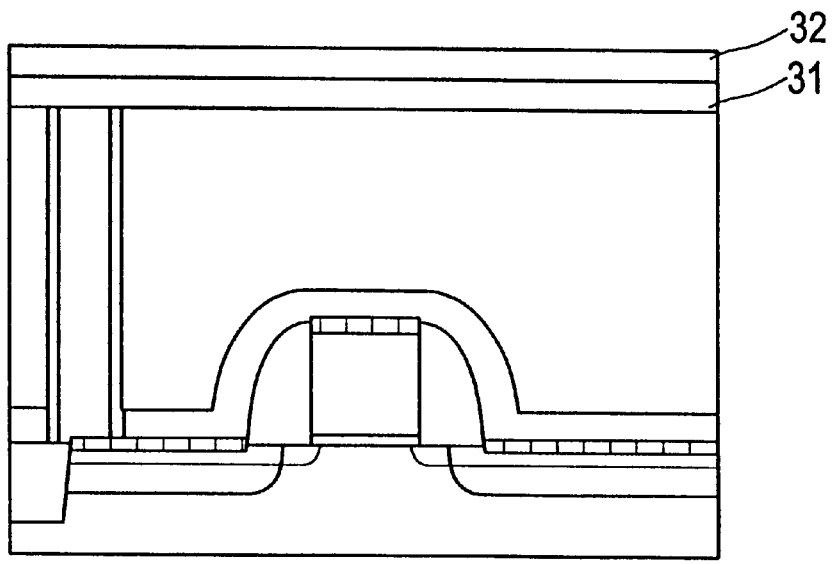
Figure 12A:
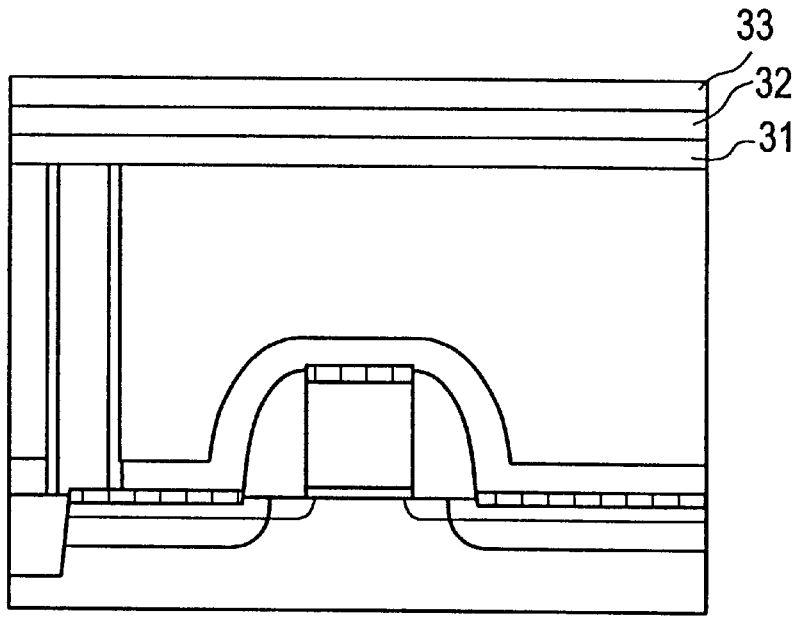
FIG. 12 is a series of schematic cross-sectional views illustrating the steps of a conventional method of manufacturing a semiconductor device.
Figure 12B:
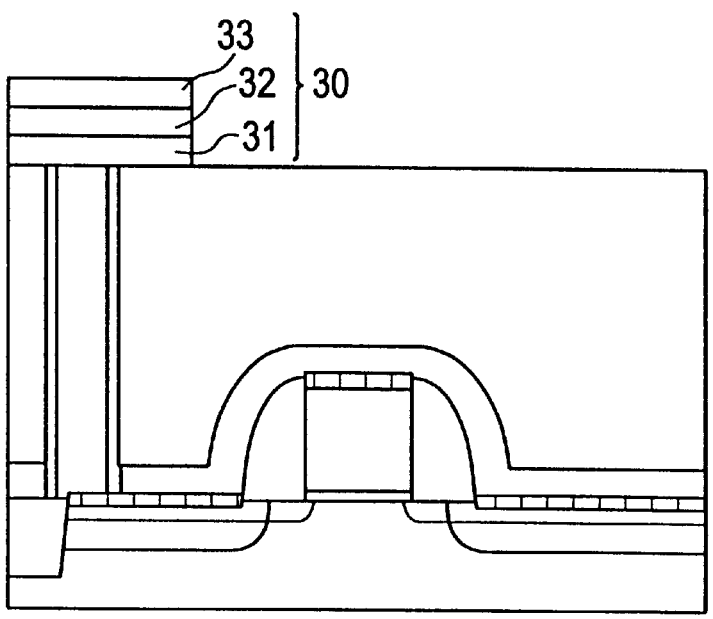
Figure 13B:
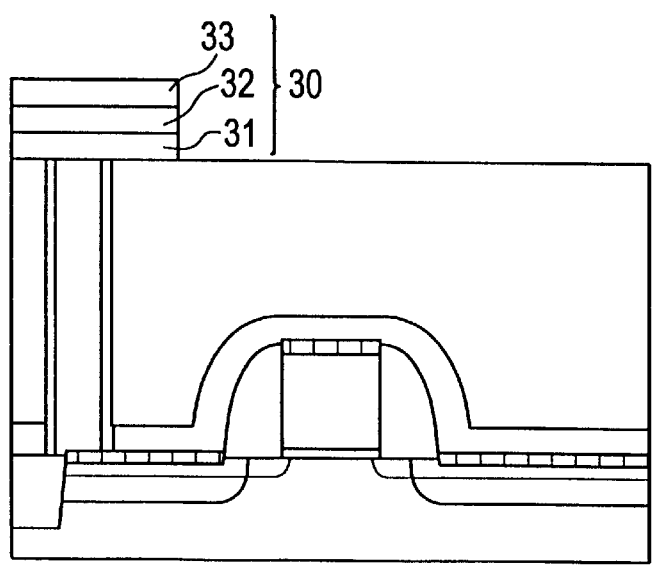

Column 6, and Column 7, lines 57, 60, 64, 1, 4, 7, 10, 13, 16, 20, 24, 27, 30,
delete "FIG. 1 is a series";
delete "FIG. 2 is a series";
delete "FIG. 3 is a series";
delete "FIG. 4 is a series";
delete "FIG. 5 is a series";
delete "FIG. 6 is a series";
delete "FIG. 7 is a series";
delete "FIG. 8 is a series";
delete "FIG. 9 is a series";
delete "FIG. 10 is a series";
delete "FIG. 11 is a series";
delete "FIG. 12 is a series";
delete "FIG. 13 is a series" and
insert -- Fig. 1a-Fig. 1d show a series --;
insert -- Fig. 2e-Fig. 29 show a series --;
insert -- Fig. 3h-Fig. 3j show a series --;
insert -- Fig. 4a-Fig. 4d show a series --;
insert -- Fig. 5e-Fig. 5g show a series --;
insert -- Fig. 6h-Fig. 6i show a series --;
insert -- Fig. 7a-Fig. 7b show a series --;
insert -- Fig. 8a-Fig. 8b show a series --;
insert -- Fig. 9a-Fig. 9b show a series --;
insert -- Fig. 10a-Fig. 10b show a series --;
insert -- Fig. 11a-Fig. 11b show a series --;
insert -- Fig. 12a-Fig. 12b show a series --;
insert -- Fig. 13a-Fig. 13b show a series --

UNITED STATES PATENT AND TRADEMARK OFFICE
CERTIFICATE OF CORRECTION

PATENT NO.    : 6,300,239 B1
DATED         : October 9, 2001
INVENTOR(S)   : Atsuki Ono It is certified that error appears in the above-identified patent and that said Letters Patent is hereby corrected as shown below:

Column 6,
Line 60, delete "view" insert -- views --

Column 9,
Lines 61-64, delete "Next, a ramp annealing treatment is carried out (FIG. 2(g)). The substrate temperature at the time of annealing is set to be approximately 950º C. and the annealing time, approximately 10 seconds."

Column 10,
Line 50, delete "ramp" insert -- lamp --

Signed and Sealed this

Twenty-first Day of January, 2003

JAMES E. ROGAN
*Director of the United States Patent and Trademark Office*